United States Patent
Jin et al.

(10) Patent No.: US 12,432,959 B2
(45) Date of Patent: *Sep. 30, 2025

(54) GALLIUM NITRIDE-ON-SILICON DEVICES

(71) Applicant: Taiwan Semiconductor Manufacturing Company, Ltd., Hsinchu (TW)

(72) Inventors: Jun-De Jin, Hsinchu (TW); Chan-Hong Chern, Palo Alto, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/408,273

(22) Filed: Jan. 9, 2024

(65) Prior Publication Data

US 2024/0145587 A1 May 2, 2024

Related U.S. Application Data

(63) Continuation of application No. 17/346,333, filed on Jun. 14, 2021, now Pat. No. 11,888,055, which is a
(Continued)

(51) Int. Cl.
*H10D 30/47* (2025.01)
*H01L 21/02* (2006.01)
(Continued)

(52) U.S. Cl.
CPC ... *H10D 30/4755* (2025.01); *H01L 21/02381* (2013.01); *H01L 21/02458* (2013.01);
(Continued)

(58) Field of Classification Search
CPC ............. H01L 29/7787; H01L 29/2003; H01L 29/66462; H01L 29/778; H01L 21/02381;
(Continued)

(56) References Cited

U.S. PATENT DOCUMENTS

| 9,112,010 B2 | 8/2015 | Lee et al. |
| 9,252,255 B2 | 2/2016 | Kim et al. |

(Continued)

FOREIGN PATENT DOCUMENTS

| CN | 105409007 A | 3/2016 |
| EP | 2 765 611 A2 | 8/2014 |

(Continued)

*Primary Examiner* — Alonzo Chambliss
(74) *Attorney, Agent, or Firm* — Merchant & Gould P.C.

(57) ABSTRACT

A gallium nitride-on-silicon structure is disclosed in which the two-dimensional electron gas (2DEG) layer is a discontinuous layer that includes at least two 2DEG segments. Each 2DEG segment is separated from another 2DEG segment by a gap. The 2DEG layer can be depleted by a p-doped gallium nitride layer that is disposed over a portion of an aluminum gallium nitride layer. Additionally or alternatively, a trench may be formed in the structure through the 2DEG layer to produce a gap in the 2DEG layer. An electrical component is positioned over at least a portion of a gap.

20 Claims, 13 Drawing Sheets

Related U.S. Application Data continuation of application No. 16/589,915, filed on Oct. 1, 2019, now Pat. No. 11,038,048.

(51) Int. Cl.
*H01L 21/762* (2006.01)
*H10D 30/01* (2025.01)
*H10D 62/85* (2025.01)

(52) U.S. Cl.
CPC .... *H01L 21/0254* (2013.01); *H01L 21/76224* (2013.01); *H10D 30/015* (2025.01); *H10D 30/47* (2025.01); *H10D 62/8503* (2025.01)

(58) Field of Classification Search
CPC ......... H01L 21/02458; H01L 21/76224; H01L 21/0254
See application file for complete search history.

(56) References Cited

U.S. PATENT DOCUMENTS

| | | |
|---|---|---|
| 9,269,790 B2 | 2/2016 | Lee et al. |
| 9,305,917 B1 | 4/2016 | Curatola et al. |
| 9,818,856 B2 | 11/2017 | Hoshi et al. |
| 11,038,048 B2 | 6/2021 | Jin et al. |
| 11,888,055 B2 * | 1/2024 | Jin .................... H01L 21/02458 |
| 2008/0169474 A1 | 7/2008 | Sheppard |
| 2010/0019279 A1 | 1/2010 | Chen et al. |
| 2010/0097105 A1 | 4/2010 | Morita et al. |
| 2010/0320505 A1 | 12/2010 | Okamoto et al. |
| 2013/0221363 A1 | 8/2013 | Prechtl et al. |
| 2014/0091311 A1 | 4/2014 | Jeon et al. |
| 2014/0117411 A1 | 5/2014 | Kanaya |
| 2014/0225161 A1 | 8/2014 | Okita et al. |
| 2014/0264453 A1 | 9/2014 | Moens et al. |
| 2015/0021666 A1 | 1/2015 | Chen et al. |
| 2015/0270355 A1 | 9/2015 | Kuraguchi et al. |
| 2016/0043208 A1 * | 2/2016 | Ikoshi ................. H01L 29/0619 257/192 |
| 2020/0111779 A1 * | 4/2020 | Machida ............. H01L 27/0605 |

FOREIGN PATENT DOCUMENTS

| | | |
|---|---|---|
| JP | 2016-207708 A | 12/2016 |
| KR | 10-2013-0075489 A | 7/2013 |
| KR | 10-2014-0042472 A | 4/2014 |
| KR | 10-2014-0053769 A | 5/2014 |
| KR | 10-2014-0085543 A | 7/2014 |
| KR | 10-2014-0110615 A | 9/2014 |
| KR | 10-2014-0110617 A | 9/2014 |
| KR | 10-2014-0130598 A | 11/2014 |
| WO | 2017/203185 A1 | 11/2017 |

* cited by examiner

GALLIUM NITRIDE-ON-SILICON DEVICES

CROSS-REFERENCE TO RELATED APPLICATIONS

This application is a continuation application of U.S. patent application Ser. No. 17/346,333, filed on Jun. 14, 2021, which is a continuation application of U.S. patent application Ser. No. 16/589,915, filed on Oct. 1, 2019, now U.S. Pat. No. 11,038,048, all of which are incorporated herein by reference.

BACKGROUND

Designers of semiconductor devices and electronic devices often look for different materials to use in the fabrication of the circuits and devices. Gallium nitride materials are increasingly used in semiconductor and electronic devices due to a number of attractive properties, including high electron mobility and the ability to transmit signals at high frequency. For example, gallium nitride materials are used in power converters, radio frequency (RF) devices, and optoelectronic devices.

Structures and devices fabricated with gallium nitride materials include electrical components such as inductors, capacitors, resistors, and transformers. For example, a power amplifier device includes an inductor. One advantage to the use of gallium nitride materials in the power amplifier device is the high Q value for the inductor. The Q value represents the quality of the inductor. Typically, an inductor with a high Q value has lower losses than an inductor with a lower Q value.

However, when an inductor is fabricated on an aluminum gallium nitride (AlGaN) layer of a gallium nitride (GaN) structure, the Q value can be limited by a two-dimensional electron gas (2DEG) layer that forms at the interface of the AlGaN layer and the GaN layer. The 2DEG layer acts as a metal layer and adversely impacts the Q value of the inductor.

It is with respect to these and other general considerations that embodiments have been described. Also, although relatively specific problems have been discussed, it should be understood that the embodiments should not be limited to solving the specific problems identified in the background.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
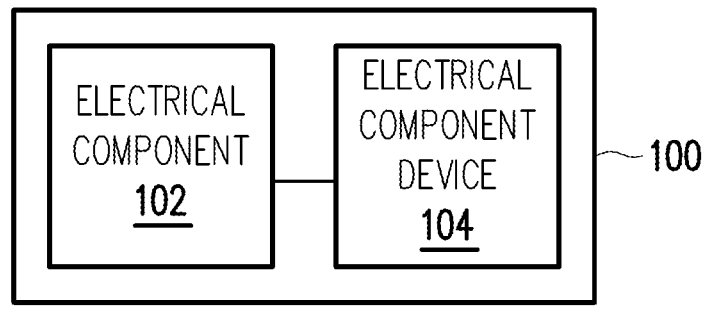
FIG. 1 illustrates a block diagram of an electronic device in which aspects of the disclosure may be practiced in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "under", "upper," "top," "bottom," "front," "back," and the like, may be used herein for ease of description to describe one element or feature's relationship to another element(s) or feature(s) as illustrated in the Figure(s). The spatially relative terms are intended to encompass different orientations of the device in use or operation in addition to the orientation depicted in the figures. Because components in various embodiments can be positioned in a number of different orientations, the directional terminology is used for purposes of illustration only and is in no way limiting. When used in conjunction with layers of an integrated circuit, semiconductor device, or electronic device, the directional terminology is intended to be construed broadly, and therefore should not be interpreted to preclude the presence of one or more intervening layers or other intervening features or elements. Thus, a given layer that is described herein as being formed on, formed over, disposed on, or disposed over another layer may be separated from the latter layer by one or more additional layers.

Embodiments described herein provide a gallium nitride (GaN)-on-silicon structure in which the two-dimensional electron gas (2DEG) layer is a discontinuous layer that includes 2DEG segments separated by a gap. In one embodiment, the 2DEG layer is depleted by a p-doped GaN layer that is disposed over a portion of the AlGaN layer. In another embodiment, a trench is formed in the structure from the frontside or the backside of the structure and through the 2DEG layer to produce a gap in the 2DEG layer. One advantage to the disclosed gallium nitride (GaN)-on-silicon structure is an on-chip inductor with a higher Q value can be achieved. Additionally, the gallium nitride (GaN)-on-silicon structure does not impact, or substantially impact, the inductance of the inductor.

These and other embodiments are discussed below with reference to FIGS. 1-14. However, those skilled in the art will readily appreciate that the detailed description given herein with respect to these Figures is for explanatory purposes only and should not be construed as limiting.

FIG. 1 illustrates a block diagram of an electronic device in which aspects of the disclosure may be practiced in accordance with some embodiments. The electronic device 100 includes one or more electrical components (represented by electrical component 102) operably connected to one or more electrical component devices (represented by electrical component device 104). The electrical component 102 includes one or more circuits or circuit components that are configured to transmit signals to, and/or receive signals from the electrical component device 104. The electrical component device 104 can include any suitable circuitry such as one or more inductors, one or more capacitors, one or more transformers, one or more resistors, and combinations thereof.

Examples of the electronic device 100 include, but are not limited to, a printed circuit board, a microwave integrated circuit (MIC), a monolithic microwave integrated circuit (MMIC), or other integrated circuit or electrical component. In one embodiment, the electrical component 102 is positioned in a first electronic device (e.g., an integrated circuit) and the electrical component device 104 is situated on a separate second electronic device. In another embodiment, the electrical component 102 and the electrical component device 104 are included in the same electronic device.

Figure 2:
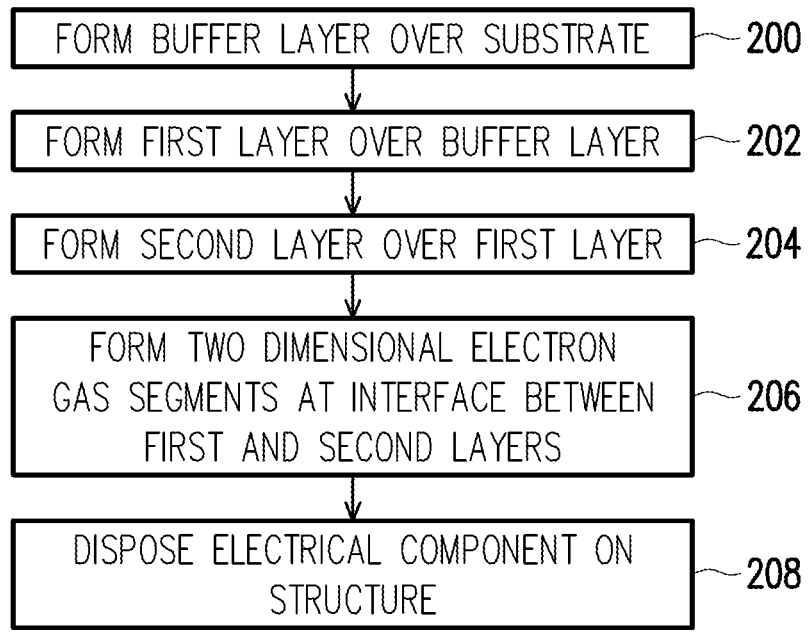
FIG. 2 depicts a flowchart of an example method of fabricating an electrical component device in accordance with some embodiments.

FIG. 2 depicts a flowchart of an example method of fabricating an electrical component device in accordance with some embodiments. Initially, as shown in block 200, a buffer layer is formed over a substrate. In one embodiment, the buffer layer is a gallium nitride layer ($Ga_xNi_{1-x}$) having a thickness of approximately 0.01~20 micrometers, and the substrate is a silicon-based substrate having a thickness of approximately 10~1000 micrometers. Other embodiments are not limited to these thicknesses.

Next, as shown in block 202, a first layer is formed over the buffer layer. A second layer is then formed over the first layer (block 204). In one embodiment, the first layer is a gallium nitride layer ($Ga_yN_{1-y}$) having a thickness of approximately 0.01~20 micrometers, and the second layer is an aluminum gallium nitride layer (AlGaN) having a thickness of approximately 0.01~20 micrometers. Other embodiments are not limited to these thicknesses.

At the interface between the gallium nitride layer, the first layer) and the aluminum gallium nitride layer (e.g., the second layer), electrons flow into the gallium nitride layer and accumulate at the interface to form a two-dimensional electron gas (2DEG) layer. As shown in block 206, 2DEG segments are formed in the 2DEG layer at the interface between the first and the second layers. The 2DEG segments are separated by a gap. An electrical component is then disposed on the structure over the second layer (block 208).

Figure 3:
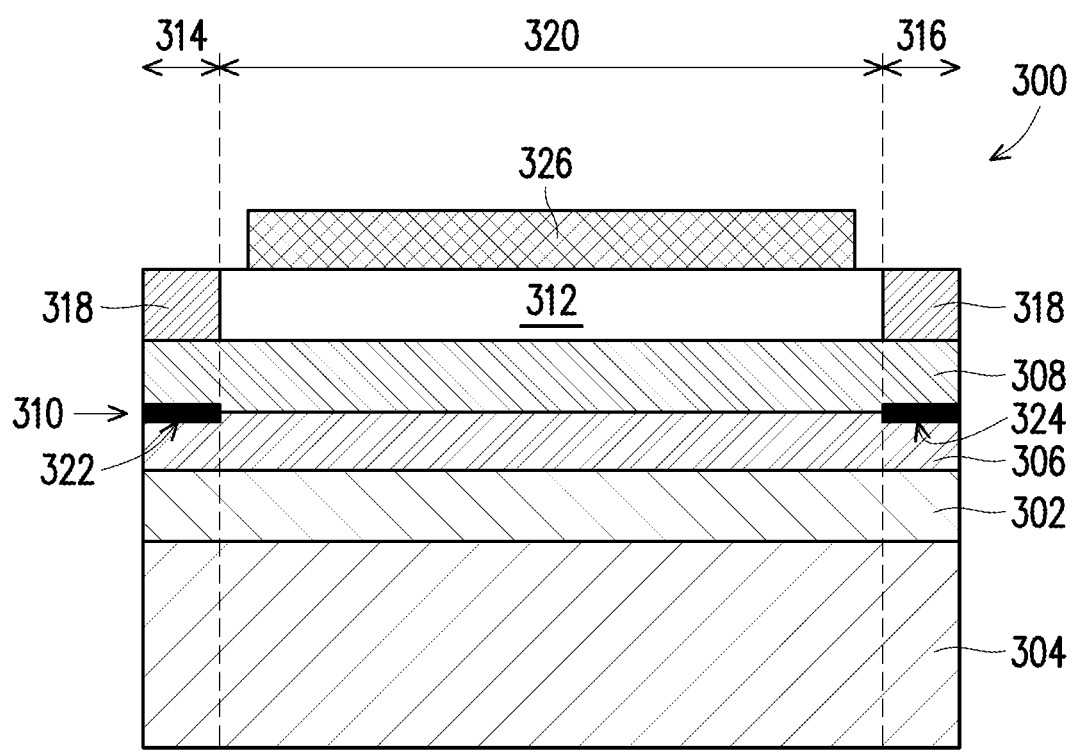
FIG. 3 illustrates a cross-sectional view of a first example of an electrical component device in accordance with some embodiments.

Disclosed herein are various techniques for forming the 2DEG segments in an electrical component device. FIG. 3 illustrates a cross-sectional view of a first example of an electrical component device in accordance with some embodiments. The electrical component device 300 includes a buffer layer 302 disposed over a substrate 304. As described previously, in one embodiment, the buffer layer 302 is a GaN layer. The GaN in the buffer layer 302 is used to gradually transfer the crystal lattice from the substrate 304 to the buffer layer 302 for lattice matching. In a non-limiting example, the substrate 304 is a high resistivity silicon substrate.

A first layer 306 is disposed over the buffer layer 302 and a second layer 308 is positioned over the first layer 306. In one embodiment, the first layer 306 is a gallium nitride layer and the second layer 308 is an aluminum gallium nitride layer (AlGaN). A 2DEG layer 310 forms at the interface between the gallium nitride layer (e.g., the first layer 306) and the aluminum gallium nitride layer (e.g., the second layer 308).

A third layer 312 is disposed over the second layer 308. In an example embodiment, the third layer 312 is a p-doped gallium nitride layer (P-GaN) having a thickness of approximately 0.01~20 micrometers. The third layer 312 is a discontinuous layer in that the third layer includes openings 314, 316. Thus, the third layer 312 is positioned over only a portion of the second layer 308. Each opening 314, 316 can have any shape, and a dielectric material 318 is disposed in the openings 314, 316.

The third layer 312 has an outline or contour that bounds the shape of the third layer 312 on the second layer 308. The third layer 312 produces a gap 320 in the 2DEG layer 310 such that the 2DEG layer 310 is a discontinuous 3DEG layer that includes 2DEG segments 322, 324. The third layer 312 depletes the 2DEG layer 310 such that the gap 320 has a shape that corresponds to the contour of the third layer 312. The 2DEG segments 322, 324 are present in the areas where the third layer 312 is absent. As shown in FIG. 3, the 2DEG segments 322, 324 are formed in the areas that correspond to the openings 314, 316.

One or more electrical components (represented by electrical component 326) is disposed over the third layer 312. In one embodiment, the electrical component is positioned over the entire gap 320 (shown in FIG. 3). In another embodiment, the electrical component 326 overlies only a portion of the gap 320. In a non-limiting example, the electrical component 326 includes one or more inductors, although other embodiments are not limited to this implementation. Other examples of the electrical component 326 include, but are not to, one or more capacitors, one or more resistors, one or more transformers, and combinations thereof.

As shown in FIG. 3, the third layer 312 underlies the electrical component 326. The third layer 312 can have any suitable dimensions. For example, in one embodiment, the dimensions of the third layer 312 are larger than the dimensions of the electrical component 326. As such, the third layer 312 extends beyond at least one dimension of the electrical component 326. In another embodiment, the dimensions of the third layer 312 substantially match the dimensions of the electrical component 326. In some instances, the dimensions of the third layer 312 are smaller than the dimensions of the electrical component 326. As such, the layer below the electrical component 326 includes both the third layer 312 and the dielectric material 318.

Figure 4:
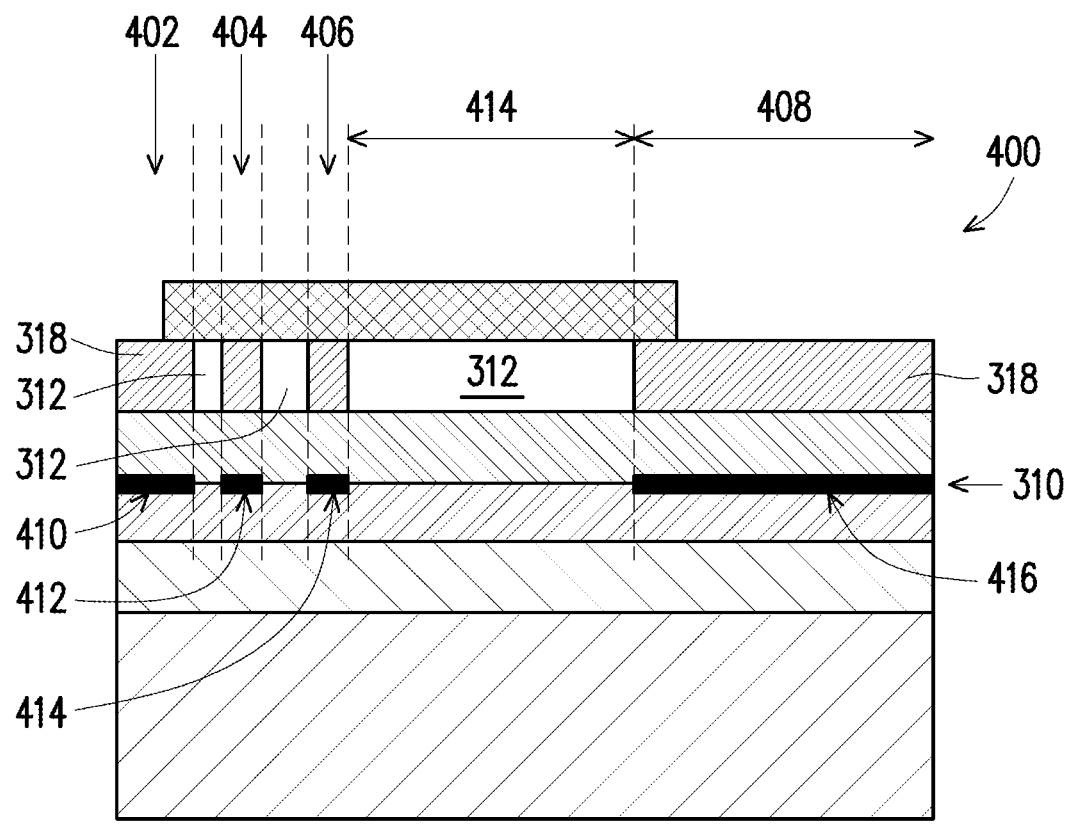
FIG. 4 depicts a cross-sectional view of a second example of an electrical component device in accordance with some embodiment.

FIG. 4 depicts a cross-sectional view of a second example of an electrical component device in accordance with some embodiment. The electrical component device 400 is similar to the electrical component device 300 shown in FIG. 3 except that the third layer 312 is patterned to produce openings 402, 404, 406, 408 in the third layer 312. The dielectric material 318 is disposed in the openings 402, 404, 406, 408 in the third layer 312.

The 2DEG layer 310 is a discontinuous layer and includes 2DEG segments 410, 412, 414, 416 positioned in the locations that correspond to areas where the third layer 312 is absent. As shown in FIG. 4, the 2DEG segments 410, 412, 414, 416 are formed in areas that correspond to the openings 402, 404, 406, 408 in the third layer 312. Like the embodiment shown in FIG. 2, the gaps between the 2DEG segments 410, 412, 414, 416 have shapes that correspond to the contours of the third layer 312.

Like the embodiment shown in FIG. 3, the third layer 312 can have any suitable dimensions. For example, in one embodiment, the dimensions of the third layer 312 are larger than the dimensions of the electrical component 326. As such, the third layer 312 extends beyond at least one dimension of the electrical component 326. In another embodiment, the dimensions of the third layer 312 substantially match the dimensions of the electrical component 326. In some instances, the dimensions of the third layer 312 are smaller than the dimensions of the electrical component 326. As such, the layer below the electrical component 326 includes both the third layer 312 and the dielectric material 318.

Figure 5:
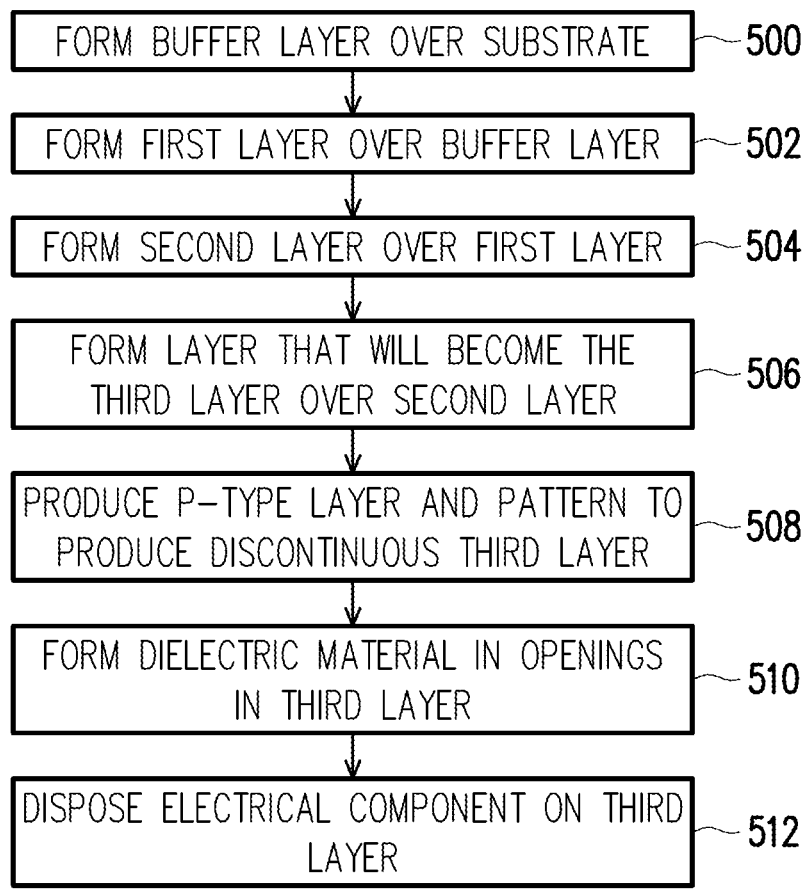
FIG. 5 illustrates a flowchart of a method of fabricating the first and the second embodiments of the electrical component device shown in FIGS. 3 and 4.

FIG. 5 illustrates a flowchart of a method of fabricating the first and the second embodiments of the electrical component device shown in FIGS. 3 and 4. Initially, as shown in block 500, the buffer layer is formed over a substrate. For example, in one embodiment, the buffer layer can be deposited or grown on the substrate. As described previously, in one embodiment, the buffer layer is a gallium nitride layer ($Ga_xN_{1-x}$) and the substrate is a high resistivity silicon substrate.

Next, as shown in block 502, the first layer is formed over the buffer layer. The second layer is then formed over the first layer (block 504). In a non-limiting example, the first layer and the second layer can be deposited or grown on the substrate. In one embodiment, the first layer is a gallium nitride layer ($Ga_yN_{1-y}$) and the second layer is an aluminum gallium nitride (AlGaN) layer.

A layer that will become the third layer is formed over the second layer at block 506. In one embodiment, the layer is a GaN layer. The layer is then doped with a p-type dopant and patterned to produce one or more openings in the third layer (block 508). For example, a p-type dopant (e.g., magnesium) is introduced into the layer during a growth process. Alternatively, the p-type dopant is implanted into the layer to produce the p-type GaN layer (P-GaN).

In one embodiment, the one or more openings in the P-GaN layer are created by forming a mask over the p-GaN layer and patterning the mask to produce one or more openings in the mask at locations that correspond to the locations of the opening(s) in the third layer. The portion of the third layer that is exposed in each opening is then removed using, for example, a chemical etch or an ion etch process. Thus, the discontinuous third layer (e.g., discontinuous P-GaN layer) is produced over the second layer.

Next, as shown in block 510, a dielectric material is formed in the one or more openings in the third layer. For example, the dielectric material is deposited into the one or more openings. The electrical component is then positioned or formed over the third layer at block 512.

Figure 6A:
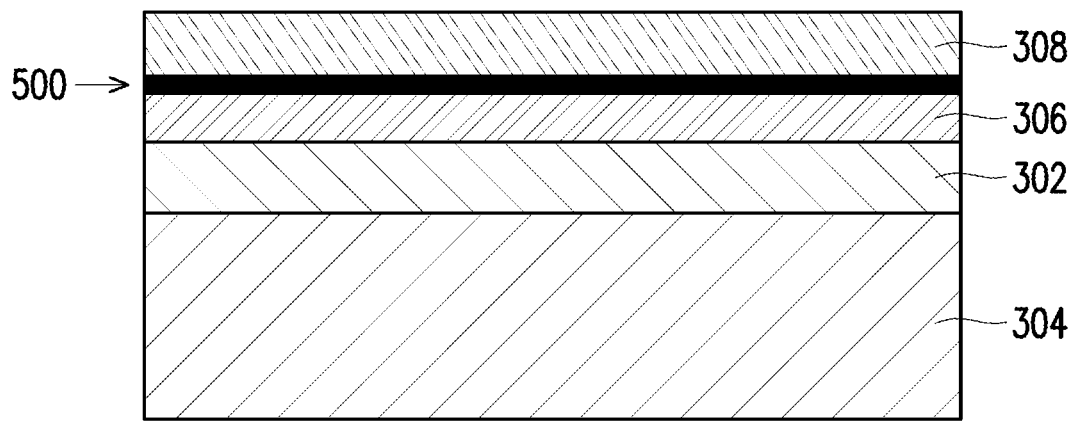
FIGS. 6A-6D depict cross-sectional views of a method of fabricating a third example of an electrical component device in accordance with some embodiments.

FIGS. 6A-6D illustrate cross-sectional views of a method of fabricating a third example of an electrical component device in accordance with some embodiments. The illustrated process produces a gap in the 2DEG layer from the frontside of the structure. In FIG. 6A, the buffer layer 302 is formed over the substrate 304. The first layer 306 is disposed over the buffer layer 302, and the second layer 308 is positioned over the first layer 306. A 2DEG layer 500 is formed at the interface between the first and the second layers 306, 308.

Figure 6B:
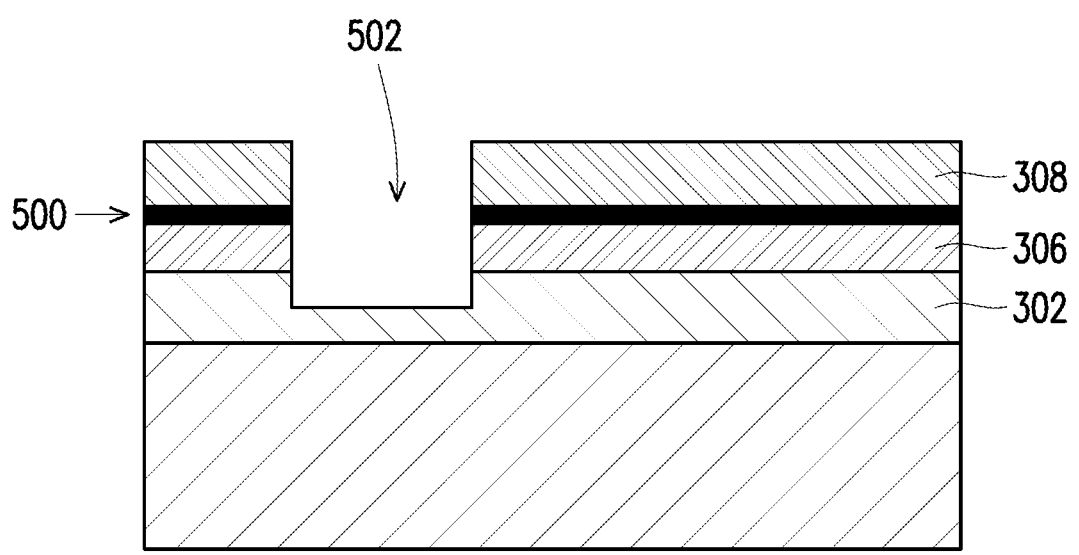
Figure 6C:
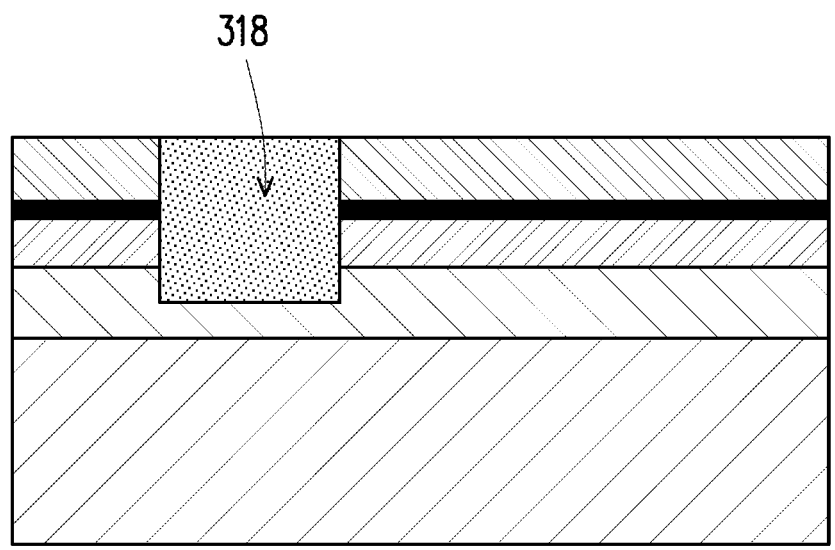

As shown in FIG. 6B, a trench 502 is formed through the second layer 308, the 2DEG layer 500, and the first layer 306 and into a portion of the buffer layer 302. A dielectric material 318 is formed in the trench 502 (FIG. 6C). In one embodiment, the dielectric material 318 is deposited into the opening. A planarization process is then performed to produce a planar surface on the structure. In a non-limiting example, the planarization process can be a chemical mechanical polishing process.

Figure 6D:
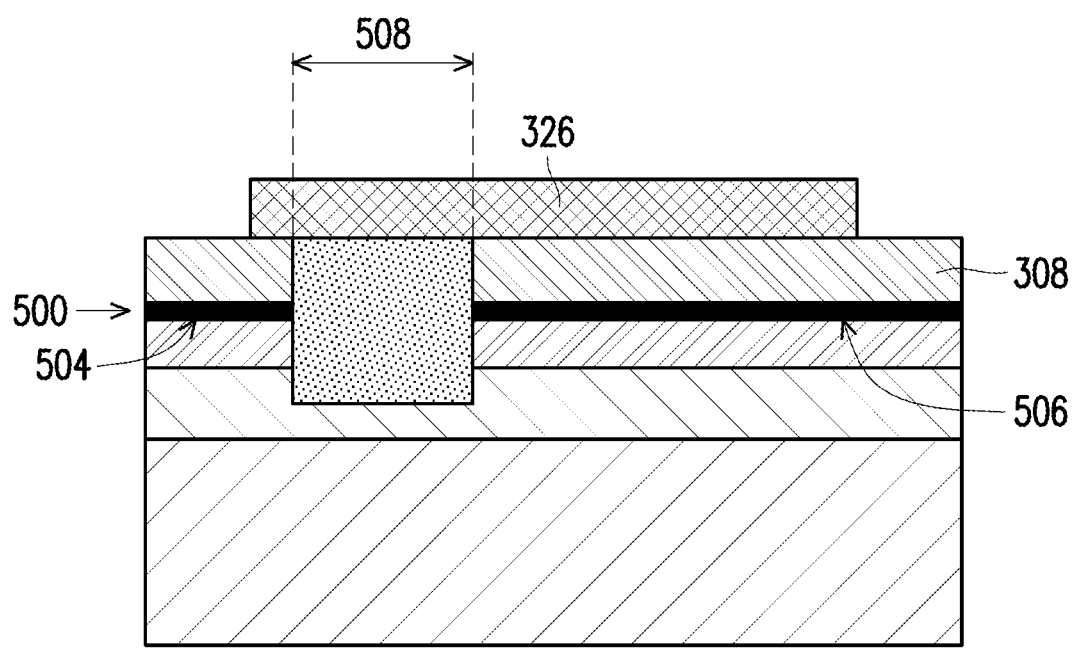

In FIG. 6D, the electrical component 326 is disposed over the second layer 308. The trench (502 in FIG. 6B) that is formed through the 2DEG layer 500 causes the 2DEG layer 500 to be a discontinuous layer that includes 2DEG segments 504, 506. As shown in FIG. 6D, the electrical component 326 overlies and extends beyond the gap 508 between the 2DEG segments 504, 506. In other embodiments, the dimensions of the gap 508 can substantially equal the dimensions of the electrical component 326, or at least one dimension of the gap 508 may be greater than a corresponding dimension of the electrical component 326.

Figure 7:
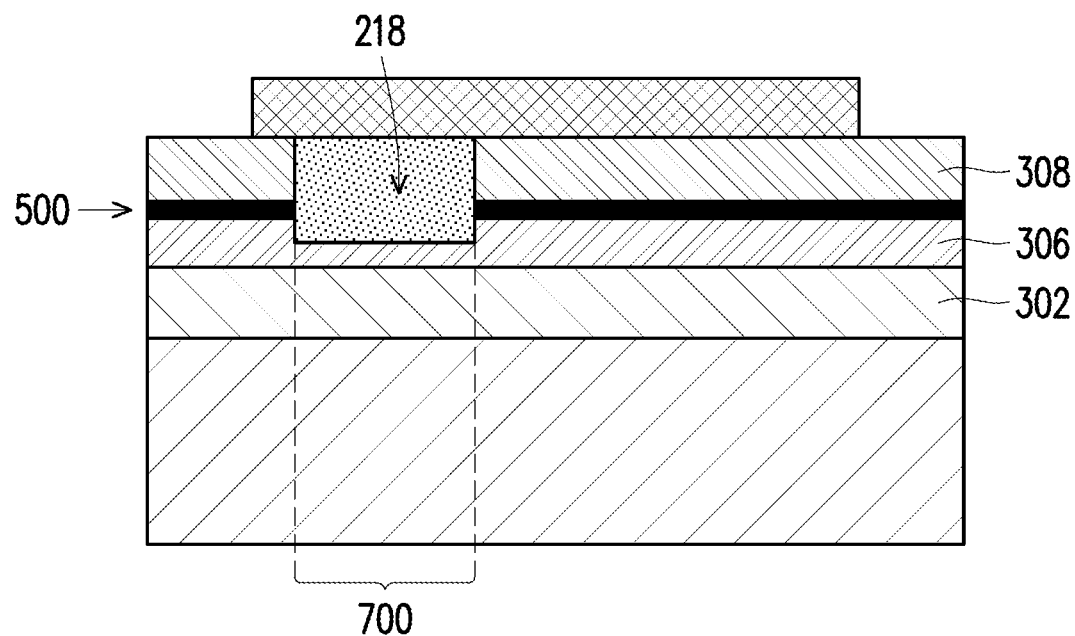
FIGS. 7-10 illustrate cross-sectional views of alternate on-chip inductors to the third example of the electrical component device shown in FIG. 6D.

FIGS. 7-10 illustrate cross-sectional views of alternate structures for the electrical component device shown in FIG. 6D. In FIG. 7, the trench 700 is formed through the second layer 308 and the 2DEG layer 500 and into a portion of the first layer 306. The trench 700 is filled with the dielectric material 218 in the illustrated embodiment.

Figure 8:
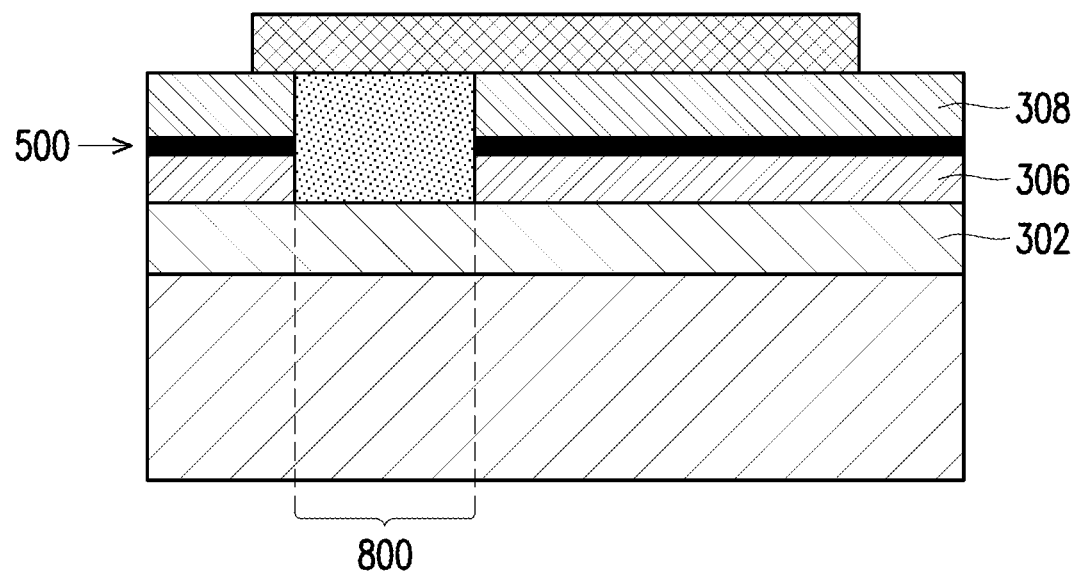
Figure 9:
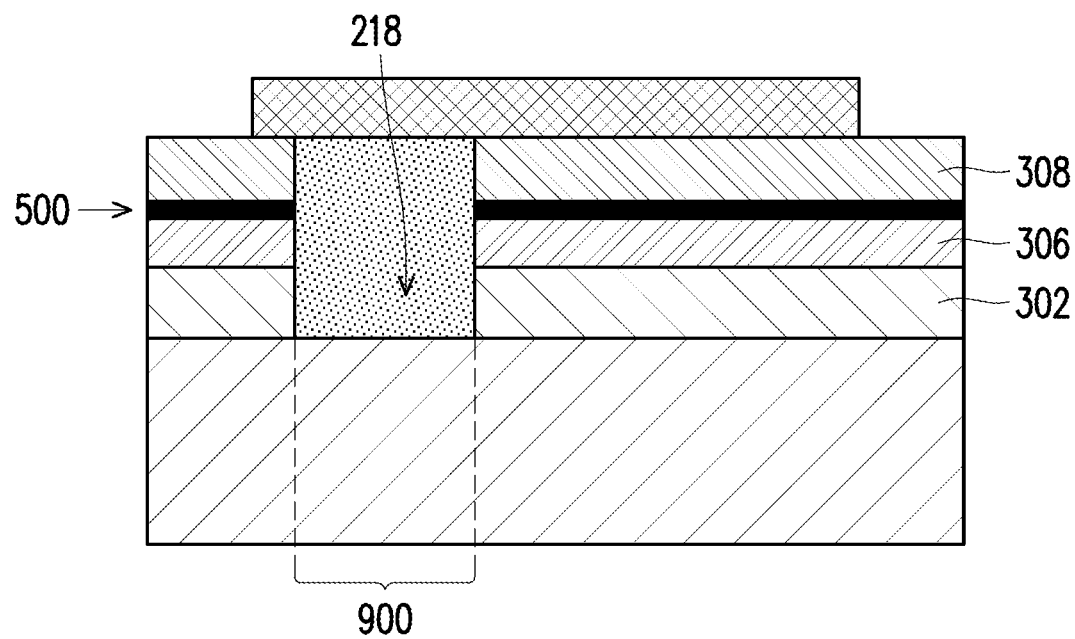
Figure 10:
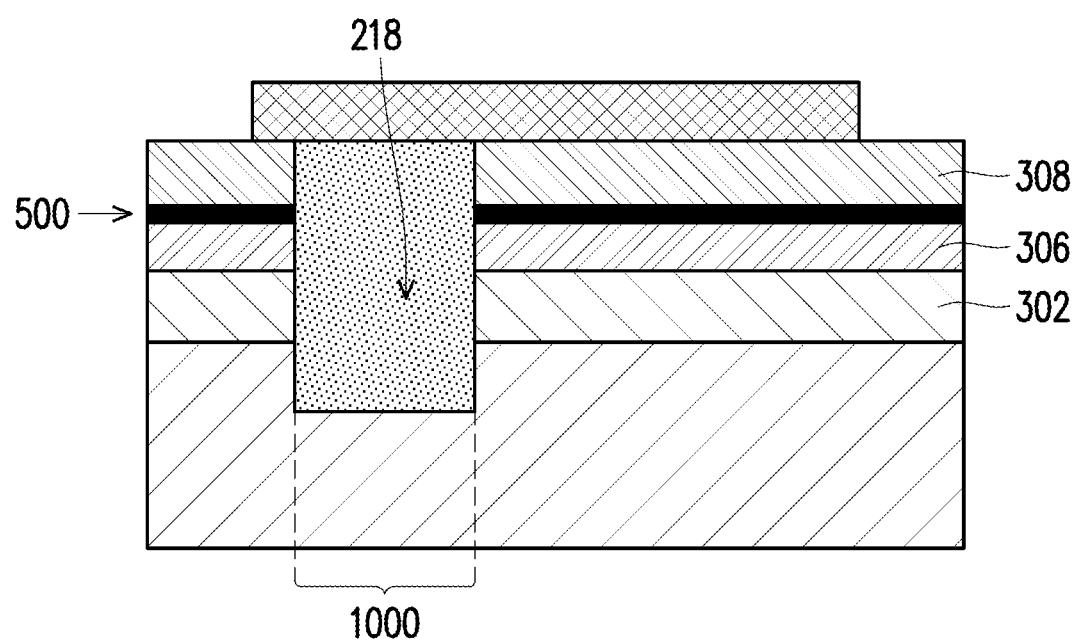

In FIG. 8, the trench 800 is formed through the second layer 308, the 2DEG layer 500 and the first layer 306. The trench 800 does not extend into the buffer layer 302 in FIG. 8. However, in FIG. 9, the trench 900 is formed through the second layer 308, the 2DEG layer 500, the first layer 306, and the buffer layer 302. As shown in FIG. 10, the trench 1000 is formed through the second layer 308, the 2DEG layer 500, the first layer 306, and the buffer layer 302 and into a portion of the substrate 204. The opening is filled with the dielectric material 218 in the embodiments shown in FIGS. 9 and 10.

Figure 11A:
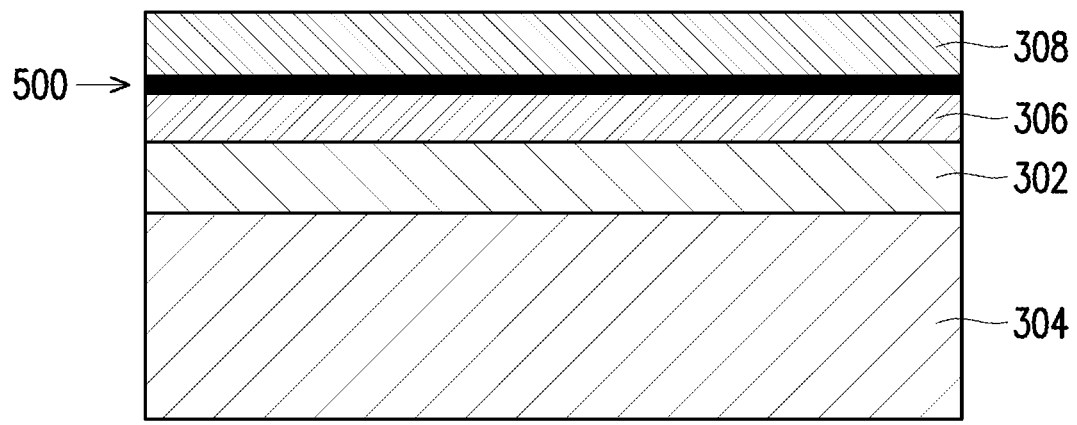
FIGS. 11A-11D depict cross-sectional views of a method of fabricating a fourth example of an electrical component device in accordance with some embodiments.

FIGS. 11A-11D depict cross-sectional views of a method of fabricating a fourth example of an electrical component device in accordance with some embodiments. The illustrated process forms a gap in the 2DEG layer from the backside of the structure. In FIG. 11A, the buffer layer 302 is formed over the substrate 304. The first layer 306 is disposed over the buffer layer 302, and the second layer 308 is positioned over the first layer 306. A 2DEG layer 500 is formed at the interface between the first and the second layers 306, 308.

Figure 11B:
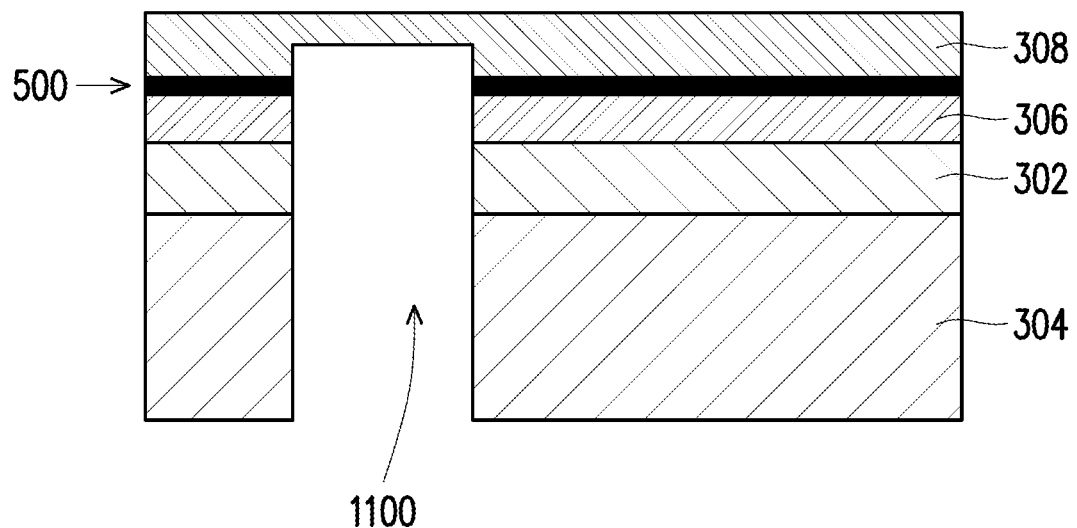
Figure 11C:
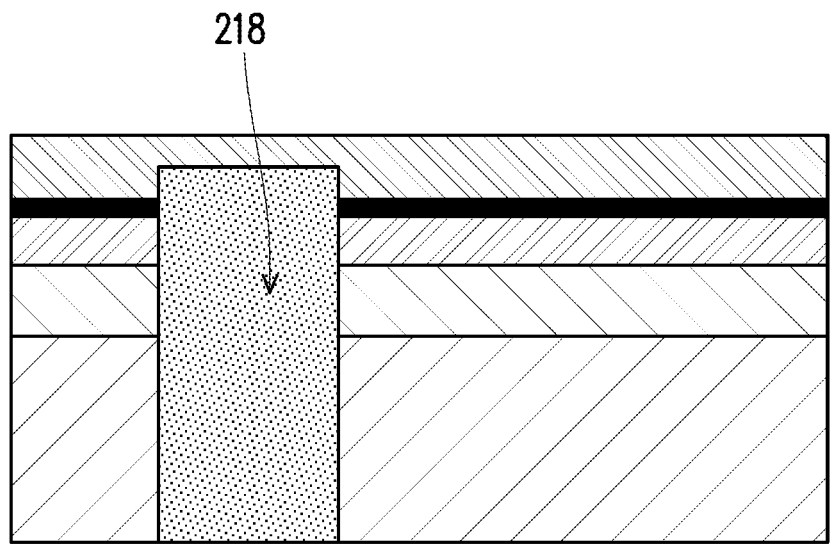

As shown in FIG. 11B, a trench 1100 is formed from the backside of the substrate 304 through the substrate 304, the buffer layer 302, the first layer 306, and the 2DEG layer 500 and into a portion of the second layer 308. In FIG. 11C, a dielectric material 218 is disposed in the trench 1100. In one embodiment, the dielectric material 218 is deposited into the trench 1100. A planarization process is then performed to produce a planar surface on the structure.

Figure 11D:
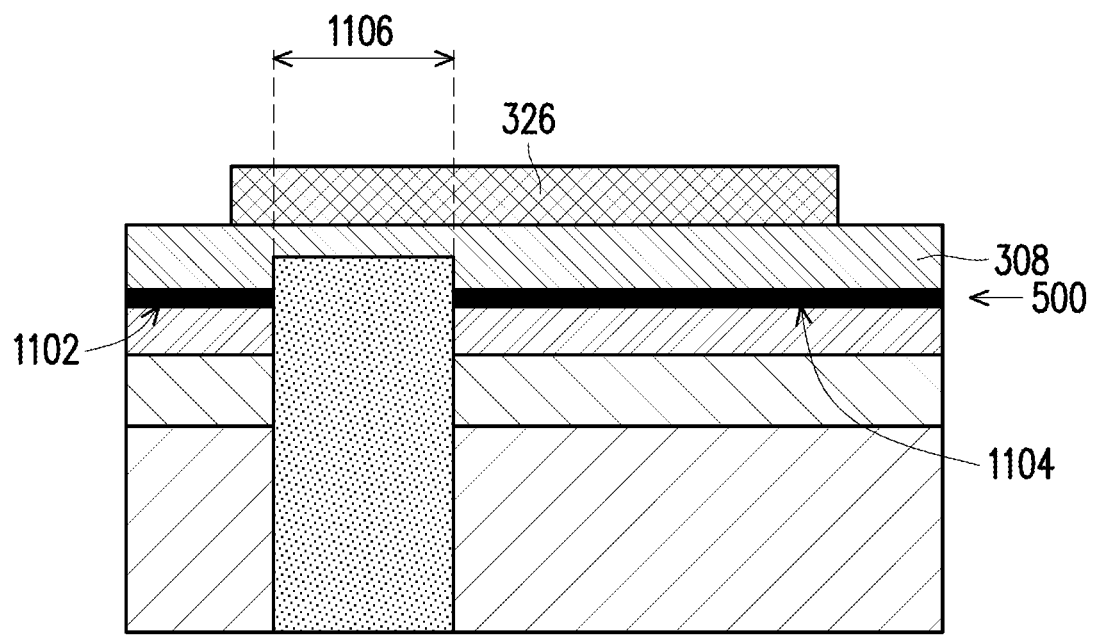

In FIG. 11D, the electrical component 326 is disposed on the second layer 308. The trench 1100 formed through the 2DEG layer 500 causes the 2DEG layer 500 to be a discontinuous layer that includes 2DEG segments 1102, 1104. As shown in FIG. 11D, the electrical component 326 overlies and extends beyond the gap 1106 between the 2DEG segments 1102, 1104. In other embodiments, the dimensions of the gap 1106 can substantially equal the dimensions of the electrical component 326, or at least one dimension of the gap 1106 may be greater than a corresponding dimension of the electrical component 326.

Figure 12:
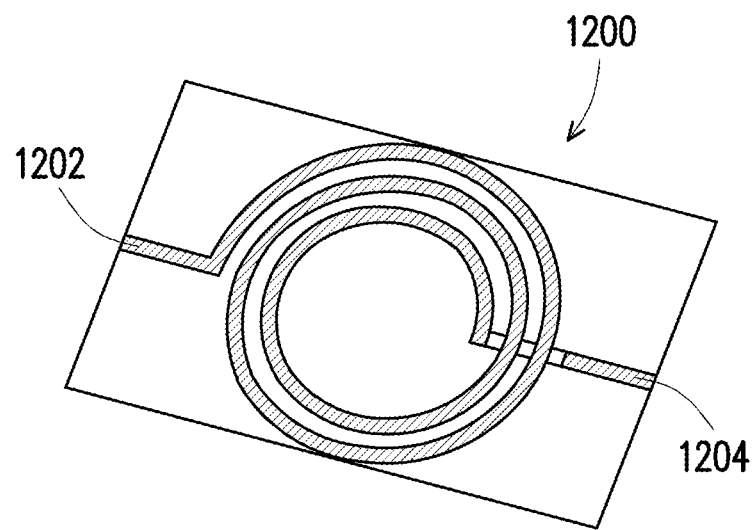
FIGS. 12-14 illustrate example inductors that are suitable for use in an electrical component device in accordance with some embodiments.
Figure 13:
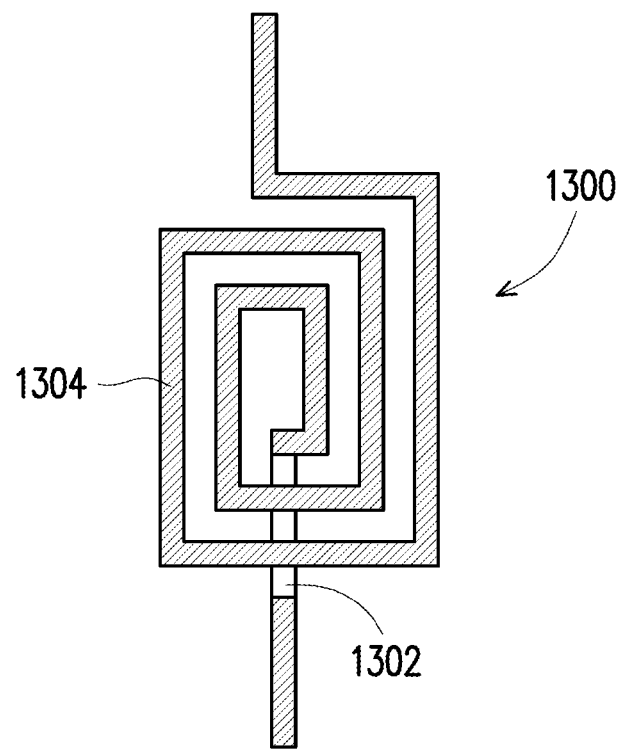
Figure 14:
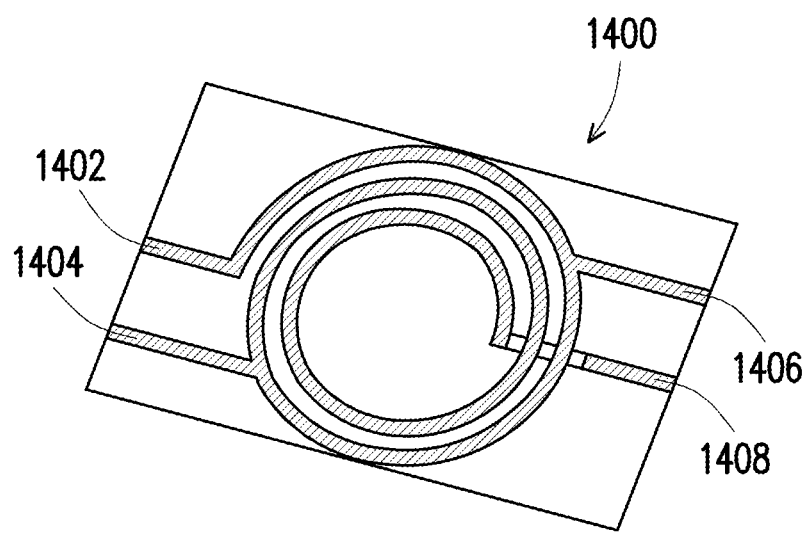

FIGS. 12-14 illustrate example inductors that are suitable for use in an electrical component device in accordance with some embodiments. The inductor can be a spiral inductor 1200, 1400 (FIGS. 12 and 14) or a rectangular inductor 1300 (FIG. 13). The inductor can have two terminals or more terminals. For example, the example inductor 1200 in FIG. 12 has two terminals 1202, 1204 and the inductor 1400 shown in FIG. 14 has four terminals 1402, 1404, 1406, 1408. Additionally, an inductor can be composed of a single metal layer or multiple metal layers. For example, the inductor 1300 is composed of a first metal layer 1302 and a second metal layer 1304.

Typically, the terminals of an inductor (e.g., inductors 1200, 1300, 1400) are operably connected to other circuitry in the electrical component device (e.g., 104 in FIG. 1) and/or in the electrical component (e.g., 102 in FIG. 1) through conductive layers in the electrical component device or in the electrical component. In one embodiment, the conductive layers are metal layers. The terminals can be connected directly to the conductive layers or the terminals may be connected to vias in via layers between the conductive layers.

Figure 15:
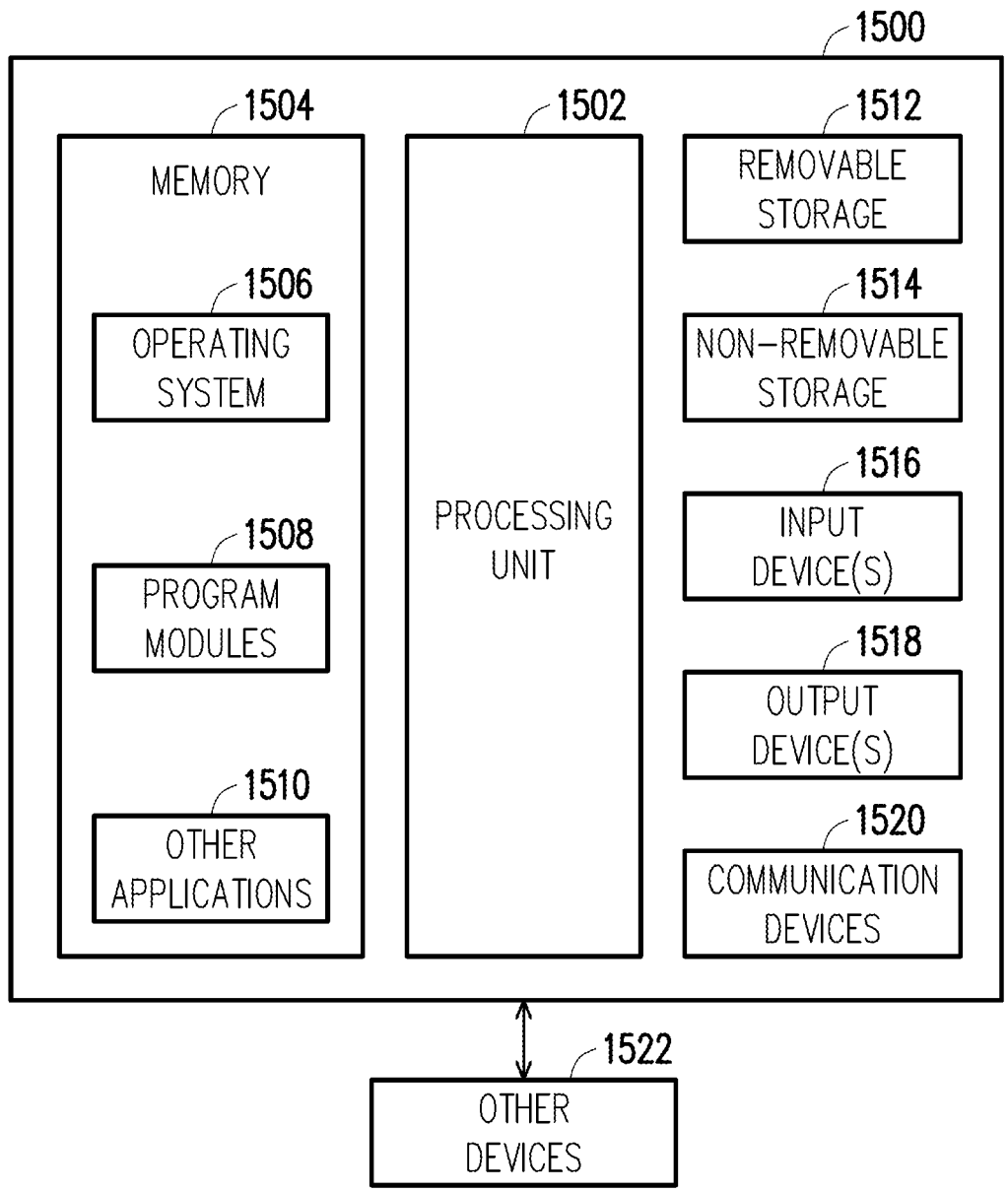
FIG. 15 depicts a block diagram of a computing device with which aspects of the disclosure may be practiced in accordance with some embodiments.

FIG. 15 depicts a block diagram of a computing device with which aspects of the disclosure may be practiced in accordance with some embodiments. In a basic configuration, the computing device 1500 may include at least one processing unit 1502 and at least one memory 1504. Any suitable processing unit or units can be used. Example processing units include, but are not limited to, a microprocessor, an application specific integrated circuit, and/or a field programmable gate array.

Depending on the configuration and type of the computing device 1500, the memory 1504 may comprise, but is not limited to, volatile storage (e.g., random access memory), nonvolatile storage (e.g., read-only memory), flash memory, or any combination of such memories. The memory 1504 may include a number of program modules and data files, such as an operating system 1506 for controlling the operation of the computing device 1500, one or more program modules 1508 suitable for parsing received input, determining subject matter of received input, determining actions associated with the input and so on, and one or more other applications 1510.

The computing device 1500 may have additional features or functionality. For example, the computing device 1500 may also include additional data storage devices (removable and/or non-removable) such as, for example, magnetic disks, optical disks, or tape. Such additional storage is illustrated in FIG. 15 by a removable storage device 1512 and a non-removable storage device 1514.

The computing device 1500 may also have one or more input device(s) 1516 such as a keyboard, a trackpad, a mouse, a pen, a sound or voice input device, a touch, force and/or swipe input device, etc. The output device(s) 1518 such as a display, speakers, a printer, etc. may also be included. The aforementioned devices are examples and others may be used. The computing device 1500 may include one or more communication devices 1520 allowing communications with other computing devices 1522. Examples of suitable communication devices 1520 include, but are not limited to, cellular, IR, NFC, RF, and/or satellite transmitter, receiver, and/or transceiver circuitry, universal serial bus (USB), parallel, and/or serial ports.

The term computer-readable media as used herein may include computer storage media. Computer storage media may include volatile and nonvolatile, removable and non-removable media implemented in any method or technology for storage of information, such as computer readable instructions, data structures, or program modules.

The memory 1504, the removable storage device 1512, and the non-removable storage device 1514 are all computer storage media examples (e.g., memory storage or memory device) that can include various combinations of the LRD circuits disclosed herein. Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the computing device 1500. Any such computer storage media may be part of the computing device 1500.

In one aspect, an electrical component device includes a buffer layer disposed over a substrate and a first layer disposed over the buffer layer. In one embodiment, the first layer comprises a layer of gallium nitride. A second layer is disposed over the first layer. In a non-limiting embodiment, the second layer is a layer of aluminum gallium nitride. A layer of a two-dimensional electron gas (2DEG) formed at an interface between the first layer and the second layer comprises a first 2DEG segment and a second 2DEG segment and a gap between the first and the second 2DEG segments. An electrical component is positioned over the second layer and over at least a portion of the gap between the first and the second 2DEG segments.

In another aspect, an electronic device includes a first electrical component and an electrical component device. The electrical component device includes a buffer layer disposed over a substrate and a first layer disposed over the buffer layer. In one embodiment, the first layer comprises a layer of gallium nitride. A second layer is disposed over the first layer. In a non-limiting embodiment, the second layer is a layer of aluminum gallium nitride. A layer of a two-dimensional electron gas (2DEG) formed at an interface between the first layer and the second layer comprises a first 2DEG segment and a second 2DEG segment and a gap between the first and the second 2DEG segments. A second electrical component is positioned over the second layer and over at least a portion of the gap between the first and the second 2DEG segments. The second electrical component is operably connected to the first electrical component.

In yet another aspect, a method of fabricating an electrical component device includes forming a buffer layer over a substrate and forming a first layer over the buffer layer. In one embodiment, the first layer comprises a layer of gallium nitride. A second layer is formed over the first layer. In a non-limiting embodiment, the second layer is a layer of aluminum gallium nitride. A first two-dimensional electron gas (2DEG) segment and a second 2DEG segment are formed at an interface between the first layer and the second layer. The first 2DEG segment is separated from the second 2DEG segment by a gap. An electrical component is disposed over the second layer and at least a portion of the gap.

In one aspect, a method of fabricating an electrical component device includes forming a buffer layer over a substrate and forming a first layer over the buffer layer. In one embodiment, the first layer comprises a layer of gallium nitride. A second layer is formed over the first layer. In a non-limiting embodiment, the second layer is a layer of aluminum gallium nitride. A third layer is formed over a portion of the second layer. In one embodiment, the third layer is a layer of a p-doped gallium nitride. A first two-dimensional electron gas (2DEG) segment and a second 2DEG segment are formed at an interface between the first layer and the second layer with a gap between the first and the second 2DEG segments. The gap corresponds to a contour of the third layer. An electrical component is disposed over the third layer and at least a portion of the gap.

In another aspect, a method of fabricating an electrical component device includes forming a buffer layer over a substrate and forming a first layer over the buffer layer. In one embodiment, the first layer comprises a layer of gallium nitride. A second layer is formed over the first layer. In a non-limiting embodiment, the second layer is a layer of aluminum gallium nitride. A two-dimensional electron gas (2DEG) layer is disposed at the interface between the first and the second layer. A trench is formed through the 2DEG layer and a dielectric material is formed in the trench. An electrical component is disposed over the second layer and at least a portion of the trench.

Aspects of the present disclosure, for example, are described above with reference to block diagrams and/or operational illustrations of methods, systems, and computer program products according to aspects of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

The description and illustration of one or more aspects provided in this application are not intended to limit or restrict the scope of the disclosure as claimed in any way. The aspects, examples, and details provided in this application are considered sufficient to convey possession and enable others to make and use the best mode of claimed disclosure. The claimed disclosure should not be construed as being limited to any aspect, example, or detail provided in this application. Regardless of whether shown and described in combination or separately, the various features (both structural and methodological) are intended to be selectively included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

What is claimed is:

1. An electronic device, comprising:
   a first electrical component;
   an electrical component device comprising:
   a buffer layer disposed over a frontside surface of a substrate;
   a first layer of gallium nitride disposed over the buffer layer;
   a second layer of aluminum gallium nitride disposed over the first layer, wherein a two-dimensional electron gas (2DEG) layer is disposed at an interface between the first layer and the second layer, and the second layer comprises a first 2DEG segment and a second 2DEG segment and a gap between the first and the second 2DEG segments;
   a second electrical component positioned over the second layer and over at least a portion of the gap between the first and the second 2DEG segments, wherein the second electrical component is operably connected to the first electrical component; and
   a third layer of p-doped gallium nitride disposed over only a portion of the second layer, wherein the gap between the first 2DEG segment and the second 2DEG segment corresponds to a contour of the p-doped gallium nitride layer.

2. The electronic device of claim 1, further comprising a trench formed from a backside surface of the substrate through the substrate, through the buffer layer, through the first layer, and through the 2DEG layer, wherein the trench creates the gap in the 2DEG layer.

3. The electronic device of claim 1, wherein the substrate is a silicon-based substrate.

4. The electronic device of claim 2, further comprising a dielectric material in the trench.

5. The electronic device of claim 1, wherein:
   the first layer of gallium nitride is a first layer of gallium nitride (GayN1-y); and
   the buffer layer is a layer of gallium nitride (GaxN1-x).

6. The electronic device of claim 1, wherein the buffer layer is configured to gradually transfer a crystal lattice from the substrate to the buffer layer for lattice matching.

7. The electronic device of claim 1, wherein the electronic device is a printed circuit board.

8. The electronic device of claim 1, wherein the electronic device is a monolithic microwave integrated circuit or a microwave integrated circuit.

9. The electronic device of claim 1, wherein the first electrical component comprises an inductor.

10. An electrical component device, comprising:
    a buffer layer disposed over a high resistivity substrate;
    a first layer of gallium nitride disposed over the buffer layer;
    a second layer of aluminum gallium nitride disposed over the first layer, wherein a layer of a two-dimensional electron gas (2DEG) formed at an interface between the first layer and the second layer comprises a first 2DEG segment and a second 2DEG segment and a gap between the first and the second 2DEG segments; and
    an electrical component positioned over the second layer and over at least a portion of the gap between the first and the second 2DEG segments.

11. The electrical component device of claim 10, further comprising a third layer of p-doped gallium nitride disposed over only a portion of the second layer, wherein the gap between the first 2DEG segment and the second 2DEG segment corresponds to a contour of the p-doped gallium nitride layer.

12. The electrical component device of claim 11, wherein the electrical component comprises an inductor positioned over the third layer overlying the second layer.

13. The electrical component device of claim 10, further comprising a trench formed from a backside through the substrate, the buffer layer, the first layer, and the layer of 2DEG, wherein the gap between the first and the second 2DEG segments is the trench.

14. The electrical component device of claim 10, further comprising a trench formed from the frontside through the second layer and the layer of 2DEG, wherein the gap between the first and the second 2DEG segments is the trench.

15. The electrical component device of claim 10, wherein the electrical component comprises an inductor.

16. A method of fabricating an electrical component device, comprising:
    forming a buffer layer over a substrate;
    forming a first layer of gallium nitride over the buffer layer;

forming a second layer of aluminum gallium nitride over the first layer;

forming a first two dimensional electron gas (2DEG) segment and a second 2DEG segment at an interface between the first layer and the second layer including forming a third layer of a p-doped gallium nitride over a portion of the second layer, wherein the first 2DEG segment is separated from the second 2DEG segment by a gap that corresponds to a contour of the third layer;

disposing an electrical component over the second layer, over the third layer and over at least a portion of the gap; and patterning the third layer to form one or more openings in the third layer prior to disposing the electrical component over the third layer, wherein an additional 2DEG segment is formed at the interface between the first layer and the second layer below each of the one or more openings in the third layer.

17. The method of claim 16, wherein the electrical component is an inductor.

18. The method of claim 16, wherein the substrate is a silicon-based substrate.

19. The method of claim 16, wherein forming the first 2DEG segment and the second 2DEG segment comprises:

forming a trench through the 2DEG layer to produce the first 2DEG segment and the second 2DEG segment, wherein the trench comprises the gap; and forming a dielectric material in the trench.

20. The method of claim 16, wherein the substrate comprises a high resistivity substrate.

* * * * *